(12) United States Patent
Earls et al.

(10) Patent No.: US 6,532,358 B1
(45) Date of Patent: Mar. 11, 2003

(54) OVERLOAD DISTORTION PROTECTION FOR A WIDEBAND RECEIVER

(75) Inventors: Jeffrey D. Earls, Forest Grove, OR (US); Donald J. Dalebroux, Vernonia, OR (US); Man-Kit Yau, Tigard, OR (US)

(73) Assignee: Tektronix, Inc., Beaverton, OR (US)

( * ) Notice: Subject to any disclaimer, the term of this patent is extended or adjusted under 35 U.S.C. 154(b) by 218 days.

(21) Appl. No.: 09/631,753

(22) Filed: Aug. 3, 2000

(51) Int. Cl.[7] ............... H04B 1/06; H04B 7/00
(52) U.S. Cl. ............... 455/234.1; 455/234.2; 455/246.1; 375/345
(58) Field of Search ............... 455/232.1, 246.1, 455/234.1, 226.1, 217, 234.2, 245.1, 245.2; 375/345

(56) References Cited

U.S. PATENT DOCUMENTS

| | | |
|---|---|---|
| 3,781,883 A | 12/1973 | Effinger et al. |
| 3,786,506 A | 1/1974 | Effinger et al. |
| 4,162,497 A | 7/1979 | Hulland et al. |
| 4,933,641 A | 6/1990 | Hsiung et al. |
| 5,175,880 A | 12/1992 | Brown |
| 5,533,064 A | 7/1996 | Ichihara |
| 5,552,788 A | 9/1996 | Ryan et al. |
| 5,758,274 A * | 5/1998 | Vu et al. .............. 455/234.2 |
| 5,839,060 A | 11/1998 | Kasperkovitz et al. |
| 5,852,772 A | 12/1998 | Lampe et al. |
| 5,896,103 A | 4/1999 | Bunch |
| 5,930,692 A | 7/1999 | Peterzell et al. |
| 6,370,210 B1 * | 4/2002 | Yamamoto .............. 375/345 |
| 6,373,907 B1 * | 4/2002 | Katsura et al. .......... 375/345 |

* cited by examiner

*Primary Examiner*—William Trost
*Assistant Examiner*—Andrew T Harry
(74) *Attorney, Agent, or Firm*—Francis I. Gray

(57) ABSTRACT

Overload distortion protection for a wideband receiver having a wideband variable gain input amplifier followed by a frequency conversion stage followed in turn by an intermediate frequency amplifier and detector to produce a measurement value in response to a signal input to the wideband variable gain input amplifier is achieved by detecting the peak power of the signal at the output of the wideband variable gain input amplifier and comparing it with the power output from the intermediate frequency amplifier and detector. If a threshold difference is exceeded, gain control signals for the wideband variable gain input and intermediate frequency amplifiers are adjusted for optimum dynamic range. If there is no range for adjusting the gain control signals, then a warning is provided to an operator to alert that the measurement value may contain distortion.

4 Claims, 2 Drawing Sheets

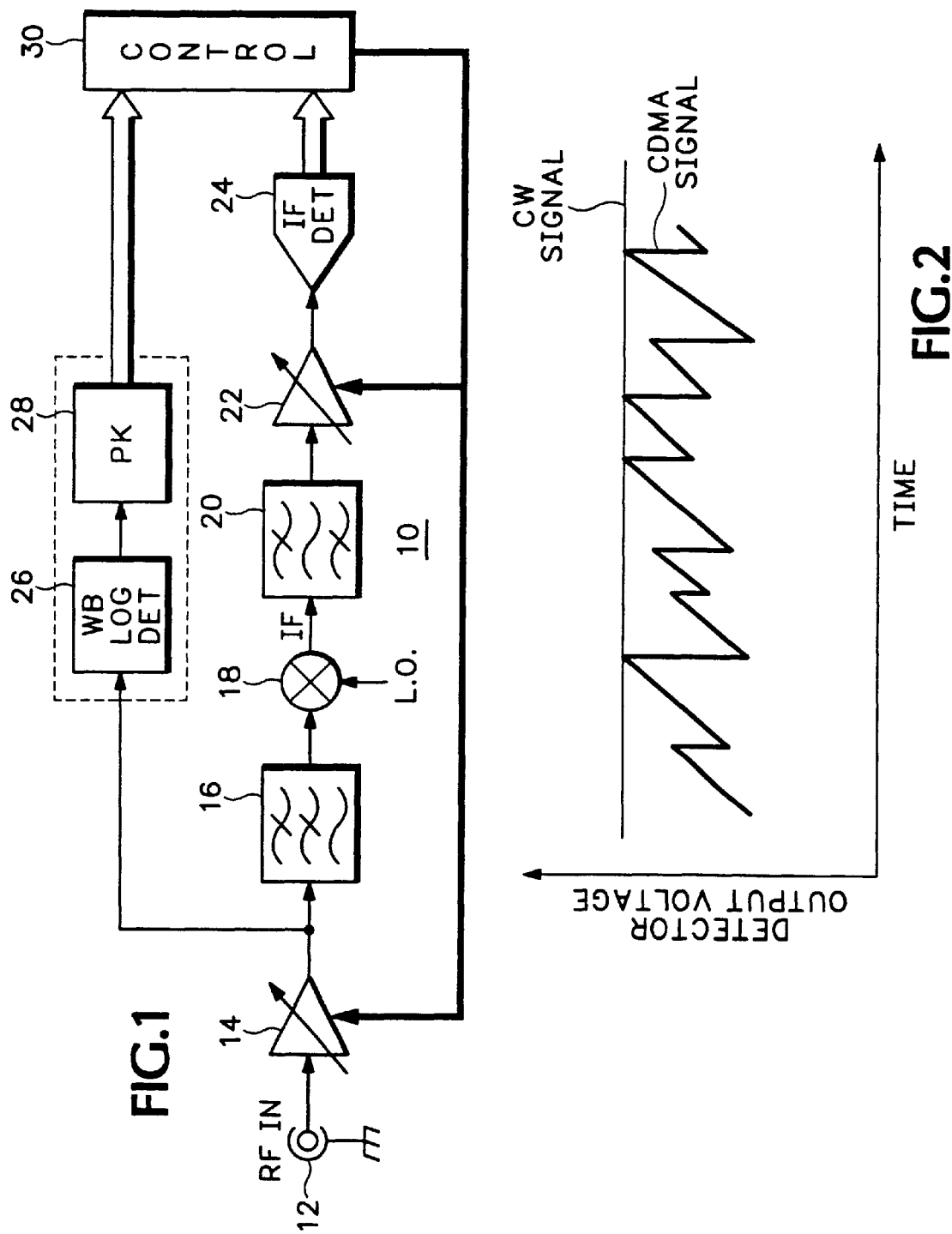

OVERLOAD DISTORTION PROTECTION FOR A WIDEBAND RECEIVER

BACKGROUND OF THE INVENTION

The present invention relates to wideband frequency conversion or heterodyne radio frequency receivers, and more particularly to overload distortion protection for such receivers which are part of a measurement instrument.

A heterodyne receiver which is used as part of a measurement instrument often requires very high dynamic range. Such a receiver typically has a wide bandwidth variable gain input stage followed by a frequency conversion stage to produce a band-limited intermediate frequency signal, and the filtering imposed on the intermediate frequency signal generally removes unwanted signals and focuses on the signal of interest. The dynamic range of the receiver is defined as the separation in amplitude between the signal of interest and any interference. At low signal strength the dynamic range is limited by the receiver's noise figure. At high signal strength the dynamic range is limited by a third-order intercept (TIO) of the receiver. A high dynamic range requirement puts stress on the frequency conversion stage, as it must contend with all signal power present in the full bandwidth input. Measurement instruments typically have an input range of several hundred megahertz up to many gigahertz of frequency span. When used for testing operational gear, this means that the instrument may be exposed to any radio signal in the environment—amplitude modulation (AM) and frequency modulation (FM) broadcast radio, very high frequency (VHF) and ultra-high frequency (UHF) National Television Standards Committee (NTSC) television broadcast, VHF and UHF 8-VSB (vestigial sideband) digital television broadcast, pagers, advanced mobile phone system (AMPS), time division multiple access (TDMA), coded division multiple access (CDMA) and general service mobile (GSM) cellular radio signals, cellular digital packet data (CDPD) modem carriers and others. Each signal type has a different modulation scheme and a different peak-to-average ratio. A signal with a higher peak-to-average ratio may cause intermodulation distortion in a receiver at a lower average power level than a continuous wave (CW) signal of the same total power would.

Optimizing dynamic range requires careful planning and control of the signal levels throughout the receiver, and especially those applied in the frequency conversion mixer. Gain through the receiver is typically adjusted to control the level of desired signal at the final detector. This gain adjustment often only takes into account the band-limited IF signals as measured at the IF detector. The result is that intermodulation distortion caused by a less well controlled wide spectrum of excess power applied to the input, and before the narrow IF filtering, may cause errors in the measurement of the signal of interest.

Any spectrum analyzer has to deal with this problem. Previous solutions have included preselection filtering of the input bandwidth into frequency sub-bands, thereby limiting the total power presented to the first mixer. This solution may involve either a bank of switch-selected filters or a single tunable filter. Preselection filtering may be expensive, both in terms of the components involved as well as the required circuit board area. A skilled user of a spectrum analyzer might also recognize the signs of receiver generated intermodulation in the display and increase the radio frequency (RF) attenuation accordingly. For an instrument that displays measurement results in other than spectral form, such as error vector magnitude (EVM) or code domain power on a CDMA signal, any receiver generated distortion is difficult, if not impossible, to discover from the results alone.

Another solution by Qualcomm Incorporated is disclosed in U.S. Pat. No. 5,930,692 "Method and Apparatus for Increasing Receiver Immunity to Interference". The power level of a received signal is detected and, if the power level meets or exceeds a predetermined power threshold, the effective gain of a low noise amplifier is decreased by inserting attenuation, either continuously or in steps, or by bypassing the low noise amplifier. This does not address the problem of high peak-to-average signals giving low readings of RF power using a logarithmic detector, i.e., it is sensitive to the type of modulation on any potential interfering signal. Also this does not optimize the dynamic range by controlling both the wideband and intermediate gains. Finally there is no indication of a warning when, despite attempts to balance the dynamic range, there still is the probability that there are distortion products in the signal display.

What is desired is an alternate approach to solving the problem of out-of-band signals, regardless of modulation type, generating distortion in an instrumentation receiver.

BRIEF SUMMARY OF THE INVENTION

Accordingly the present invention provides overload distortion protection for a wideband receiver by detecting the signal power output from a wide bandwidth low noise variable gain input amplifier, the wideband detector including a peak detector. The detected signal power and an IF signal power at the output of the wideband receiver are processed by a controller to determine appropriate gain to be applied to the variable gain input amplifier and an IF amplifier to achieve wide dynamic range without intermodulation distortion. The controller sets the gain of the variable gain input amplifier to provide a nominal amplitude of the input RF signal to a frequency gain stage, and sets the gain for the IF amplifier to provide a maximum amplitude value that uses the full scale for an AND converter. Periodically the controller polls the RF and IF powers and compares the two to determine an optimum gain for the variable gain input and IF amplifiers, or indicates an error in the measurement if the input signal is so large as to result in distortion in the output measurement.

The objects, advantages and other novel features of the present invention are apparent from the following detailed description when read in conjunction with the appended claims and attached drawing figures.

BRIEF DESCRIPTION OF THE SEVERAL VIEWS OF THE DRAWING

FIG. 1 is a block diagram view of a wideband receiver with overload distortion protection according to the present invention.

FIG. 2 is a power waveform diagram comparing different signals of interest having different peak-to-average power ratios.

DETAILED DESCRIPTION OF THE INVENTION

Figure 3:
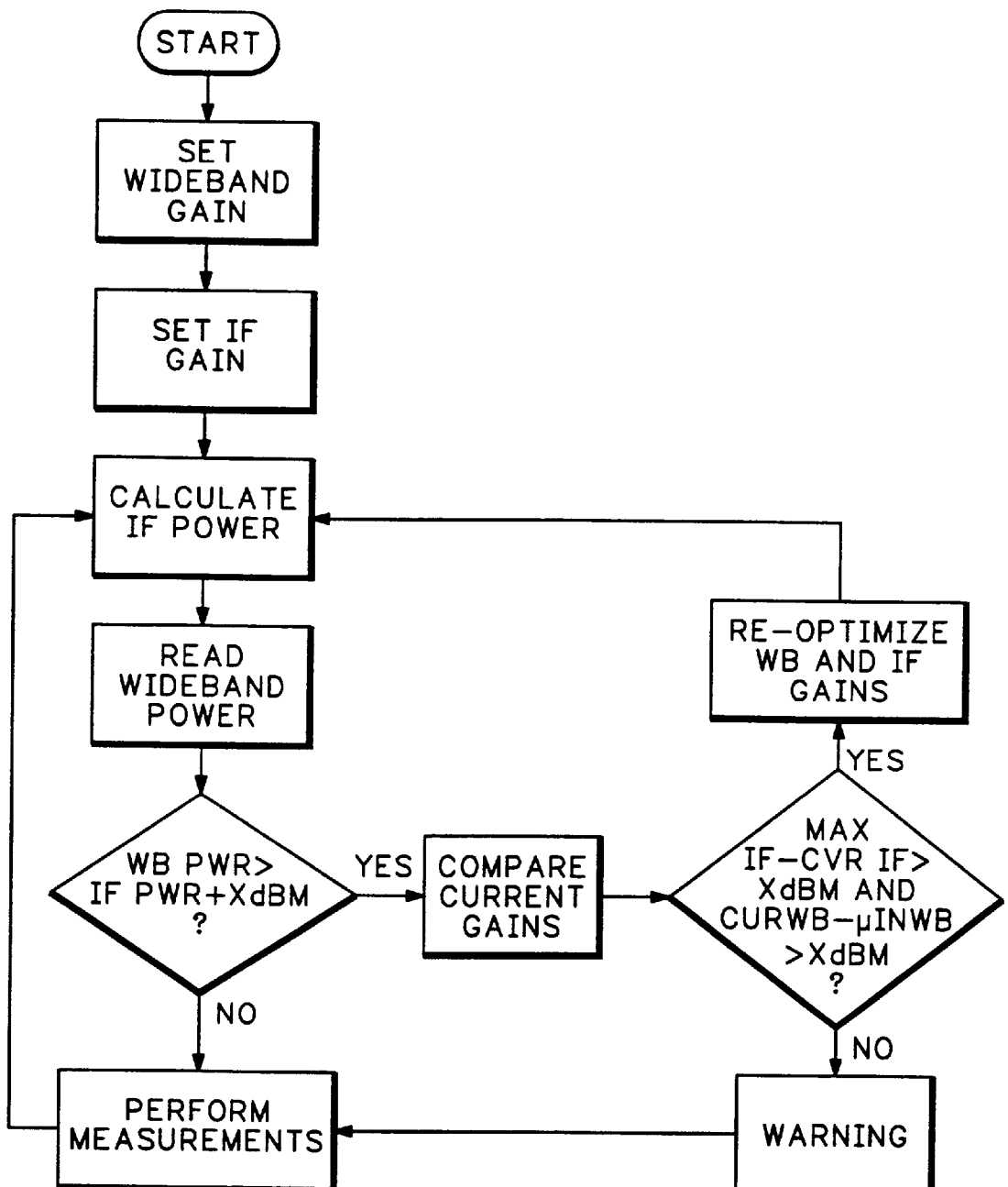
FIG. 3 is a flow chart view of a method of overload distortion protection for a wideband receiver according to the present invention.

Referring now to FIG. 1 a frequency conversion or heterodyne wideband receiver 10 is shown having an RF input terminal 12. An RF input signal is coupled via the RF input terminal 12 to a wideband variable gain input amplifier 14. The output from the wideband variable gain input amplifier 14 is input via a lowpass filter 16 to a mixer stage 18. The RF signal is frequency converted by mixing the RF signal with a local oscillator (LO) signal in the mixer stage 18 to produce an intermediate frequency (IF) signal. The IF signal is input to a narrow bandpass filter 20 to obtain a signal of interest for measurement. The filter IF signal is input to an IF gain controlled amplifier 22, the output of which is input to an IF detector 24. Except for the lowpass filter 16 this is a conventional frequency conversion or heterodyne receiver. The lowpass filter 16 removes the image frequency at the local oscillator plus intermediate frequency which would convert into the IF signal and cause overlapping of signals and residual spurs.

The output from the wideband amplifier 14 also is input to a wideband logarithmic detector 26. The output from the wideband detector 26 is input to a peak detector 28 to provide a measure of wideband RF input power. The RF input power and IF detected signal are input to a controller 30 which generates from these inputs respective gain control signals for the wideband and IF amplifiers 14, 22 respectively. This wideband detection scheme samples the total power across the receiver input bandwidth as applied to the mixer stage 18. The processing algorithm implemented by the controller 30, as described below, compares the power measurement from the wideband detector 26, 28 with that of the IF detector 24. In order for the processing algorithm to work properly the wideband detector 26, 28 has to measure the correct total average power regardless of the signal type/types being measured. A typical voltage detector has a different voltage output for signals of the same total average power but with different peak-to-average ratios. To resolve this problem the peak detector 28 samples the voltage output from the wideband detector 26 so that the final voltage output is the same for equivalent power signals with different peak-to-average ratios, as shown in FIG. 2.

The processing algorithm is shown in detail in FIG. 3. The controller 30 reads the output from the wideband detector 26, 28 and sets a gain control value for the wideband variable gain input amplifier 14 in order to provide a nominal amplitude of the RF signal to the mixer stage 18. Likewise the controller 30 reads the output from the IF detector 24 and sets a gain control value for the IF amplifier 22 to provide a maximum amplitude value for the IF signal to put it close to full scale for the analog-to-digital converter (A/D) in the IF detector. Then periodically the controller 30 polls the power from the IF detector 24 together with the wideband detector power and compares the two—is the wideband power greater than the IF power by a given number of dBm? If the comparison answer is "no", then the measurement of the IF signal is performed.

If the comparison answer is "yes", then the current wideband and IF gain settings are compared—is the maximum IF gain less the current IF gain greater than a specified dBm AND is the current wideband gain less the minimum wideband gain greater than the specified dBm? If the answer is "no"then the user is warned that the display or measurements may be impaired and measurements are performed on the IF signal. If the answer is "yes", then the respective gains of the wideband and IF amplifiers may be re-optimized by increasing the IF gain by the specified dBm and decreasing the wideband gain by the specified dBm. The IF power is again calculated and the comparison of the wideband power to the IF power is redetermined.

Thus the present invention provides overload distortion protection for a wideband receiver by detecting the full bandwidth RF power at the input to the receiver using a peak detector, and comparing periodically the RF power with the output IF power to adjust the input and IF amplifiers for optimum gain or to provide an error indicator that the resulting measurement may be distorted.

What is claimed is:

1. A wideband receiver with overload distortion protection of the type having a wideband variable gain input amplifier followed by a frequency conversion stage followed by an intermediate frequency amplifier and detector to produce a measurement value in response to an input radio frequency signal input to the wideband input amplifier further comprising:

means for detecting peak power for the input radio frequency signal applied to the frequency conversion stage from the wideband variable gain input amplifier; and means for comparing the peak power from the detecting means with power from the intermediate frequency amplifier and detector to generate gain control signals for the wideband variable gain input amplifier and the intermediate frequency amplifier and detector to optimize the dynamic range of the wideband receiver and to indicate when distortion may be present in the measurement value.

2. The wideband receiver as recited in claim I wherein the detecting means comprises:

a wideband logarithmic detector having an input coupled to receive an output from the wideband variable gain input amplifier; and a peak detector having an input coupled to receive an output from the wideband logarithmic detector and providing the peak power to the comparing means.

3. The wideband receiver as recited in claims 1 or 2 further comprising a lowpass filter coupled between the wideband variable gain input amplifier and the frequency conversion stage for removing a portion of the input radio frequency signal which would convert into overlapping signals and residual spurs at the intermediate frequency amplifier and detector.

4. A method of overload distortion protection for a wideband receiver of the type having a wideband variable gain input amplifier followed by a frequency conversion stage followed by an intermediate frequency amplifier and detector to produce a measurement value, the gain of the wideband input and intermediate frequency amplifiers being controlled by gain control signals from a controller, comprising the steps of:

determining power output from the wideband variable gain input amplifier and from the intermediate amplifier and detector;

comparing the power output from the wideband variable gain input amplifier with the power output from the intermediate amplifier and detector;

adjusting the gain control signals for optimum dynamic range for the wideband receiver if the power output from the wideband variable gain input amplifier exceeds the power output from the intermediate amplifier and detector by a specified amount and there is a range for further adjustment of the gain control signals;

warning an operator of possible distortion in the measurement value if the power output from the wideband variable gain input amplifier exceeds the power output from the intermediate amplifier and detector by the specified amount and there is no range for further adjustment of the gain control signals.

* * * * *